US009360021B2

(12) United States Patent
Berry et al.

(10) Patent No.: US 9,360,021 B2
(45) Date of Patent: *Jun. 7, 2016

(54) THERMAL CONTROL SYSTEM BASED ON NONLINEAR ZONAL FAN OPERATION AND OPTIMIZED FAN POWER

(71) Applicant: International Business Machines Corporation, Armonk, NY (US)

(72) Inventors: Robert Walter Berry, Round Rock, TX (US); Diyanesh Babu Vidyapoornachary Chinnakkonda, Bangalore (IN); Prasanna Jayaraman, Bangalore (IN); Vijay Anand Mathiyalagan, Chennai (IN); Tony Emile Sawan, Round Rock, TX (US); Eakambaram Rangaswamy Thirumalai, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 701 days.

This patent is subject to a terminal disclaimer.

(21) Appl. No.: 13/741,302

(22) Filed: Jan. 14, 2013

(65) Prior Publication Data

US 2014/0112754 A1    Apr. 24, 2014

Related U.S. Application Data

(63) Continuation of application No. 13/654,540, filed on Oct. 18, 2012.

(51) Int. Cl.
*G05D 23/00* (2006.01)
*F04D 27/00* (2006.01)
*H05K 7/20* (2006.01)

(52) U.S. Cl.
CPC ............ *F04D 27/00* (2013.01); *H05K 7/20836* (2013.01)

(58) Field of Classification Search
CPC ............................ F04D 27/00; H05K 7/20836
USPC ................. 700/299, 300; 415/1; 361/695
See application file for complete search history.

(56) References Cited

U.S. PATENT DOCUMENTS 6,702,665 B1   3/2004  Tai
8,140,196 B2   3/2012  Rozzi et al. ................... 700/300
(Continued)

FOREIGN PATENT DOCUMENTS

| JP | 2010-108324 A | 5/2010 | ................ G06F 1/26 |
| JP | 2011-65444 A | 3/2011 | ................ G06F 1/20 |
| WO | WO 2010/050080 A1 | 5/2010 | ................ G06F 1/20 |

OTHER PUBLICATIONS

Anonymous; "Method for controlling CPU fan speed using CPU power consumption as the feedback parameter," IP.com No. IPCOM000019984D, IP.com, Electronic Publication, Oct. 2003, 8 pages.

(Continued)

*Primary Examiner* — Mohammad Ali
*Assistant Examiner* — Yuhui R Pan
(74) *Attorney, Agent, or Firm* — VanLeeuwen & VanLeeuwen; Steven L. Bennett

(57) ABSTRACT

An approach is provided in which a cooling manager retrieves pre-characterization data corresponding to a fan that electronic components included in a computer system. The pre-characterization data includes operational zones based upon fan power measurements and fan speed settings. The cooling manager sets the fan to a first speed setting within a first operational zone, and detects that one of the components generates a temperature change value that exceeds a specified temperature change value corresponding to the component. In turn, the cooling manager selects a second operational zone and sets the fan to a second speed setting within the second operational zone.

7 Claims, 9 Drawing Sheets

(56) References Cited

U.S. PATENT DOCUMENTS

| | | | |
|---|---|---|---|
| 2003/0011984 A1* | 1/2003 | Chu | G06F 1/206 361/679.48 |
| 2004/0264124 A1 | 12/2004 | Patel et al. | 361/679.46 |
| 2009/0089604 A1* | 4/2009 | Malik | G06F 1/28 713/340 |
| 2009/0167228 A1 | 7/2009 | Chung et al. | |
| 2010/0110626 A1 | 5/2010 | Schmitt et al. | 361/679.47 |
| 2011/0254489 A1 | 10/2011 | Greetham | |
| 2014/0025208 A1* | 1/2014 | Allen-Ware | G06F 11/2023 700/276 |

OTHER PUBLICATIONS

Office Action for U.S. Appl. No. 13/654,540 (Berry et al., "Thermal Control System Based on Nonlinear Zonal Fan Operation and Optimized Fan Power," filed Oct. 18, 2012), U.S. Patent and Trademark Office, mailed Mar. 4, 2015, 16 pages.

Final Office Action for U.S. Appl. No. 13/654,540 (Berry et al., "Thermal Control System Based on Nonlinear Zonal Fan Operation and Optimized Fan Power," filed Oct. 18, 2012), U.S. Patent and Trademark Office, mailed Jun. 17, 2015, 19 pages.

* cited by examiner

Pre-charactierization Data Table — 200

| Total Power | Processor Power | Memory Power | I/O Pwr | Fan Speed | Temperature | | | | | |
|---|---|---|---|---|---|---|---|---|---|---|
| | | | | | Proc 0 | Proc 1 | Mem 1 | Mem 2 | IO 1 | IO 2 |
| P1 | X1a | Y1a | Z1a | F1 | P0t0 | P1t0 | M0T0 | M1T0 | IO0T0 | IO1T0 — 260 |
| | X1b | Y1b | Z1b | F2 | P0t1 | (P1t1) | M0T1 | M1T1 | IO0T1 | IO1T1 — 265 |
| | X1c | Y1c | Z1c | F3 | (P0t2) | P1t2 | M0T2 | (M1T2) | IO0T2 | IO1T2 — 270 |
| Pn | Xna | Yna | Zna | Fn-2 | P0t3 | P1t3 | (M0T3) | M1T3 | IO0T3 | IO1T3 — 275 |
| | Xnb | Ynb | Znb | Fn-1 | P0t4 | P1t4 | M0T4 | M1T4 | (IO0T4) | IO1T4 — 280 |
| | Xnc | Ync | Znc | Fn | P0t5 | P1t5 | M0T5 | M1T5 | IO0T5 | (IO1T5) — 285 |

| ZONAL TABLE 400 | | |
|---|---|---|
| ZONE ID | AVG POWER | FAN SPEED (RPM) |
| 1 | 10W | 1750 |
| | | 2750 |
| 2 | 23W | 2760 |
| | | 3350 |
| 3 | 35W | 3360 |
| | | 3850 |
| 4 | 46W | 3900 |
| | | 4150 |
| 5 | 57W | 4200 |
| | | 4500 |
| 6 | 69W | 4550 |
| | | 4750 |
| 7 | 83W | 4800 |
| | | 5050 |
| 8 | 99W | 5100 |
| | | 5300 |
| 9 | 118W | 5350 |
| | | 5700 |

THERMAL CONTROL SYSTEM BASED ON NONLINEAR ZONAL FAN OPERATION AND OPTIMIZED FAN POWER

BACKGROUND

The present disclosure relates to reducing overall system power requirements by optimizing cooling fan performance.

Computer systems include various components that comprise various subsystems. For example, a server may include multiple processors that are grouped into processor subsystems, as well as multiple memory devices that are grouped into memory subsystems. A computer system may include fans to cool the components when they exceed a particular temperature due to increased workload. For example, a processor may be tasked to process a large amount of data in a short amount of time, thus requiring increased frequency and voltage requirements and, as a result, generating more heat. In turn, a cooling manager increases fan speed to cool the processor after it reaches a particular temperature. As the fans increase in speed, the fans consume more power and add to the overall computer system's power requirements.

BRIEF SUMMARY

According to one embodiment of the present disclosure, an approach is provided in which a cooling manager retrieves pre-characterization data corresponding to a fan that electronic components included in a computer system. The pre-characterization data includes operational zones based upon fan power measurements and fan speed settings. The cooling manager sets the fan to a first speed setting within a first operational zone, and detects that one of the components generates a temperature change value that exceeds a specified temperature change value corresponding to the component. In turn, the cooling manager selects a second operational zone and sets the fan to a second speed setting within the second operational zone.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein:

FIG. 2 is a diagram showing pre-characterization data entries that include component data and fan data;

FIG. 4 is a diagram showing a zonal table that includes pre-characterization data grouped in to operational zones;

DETAILED DESCRIPTION

Figure 1:
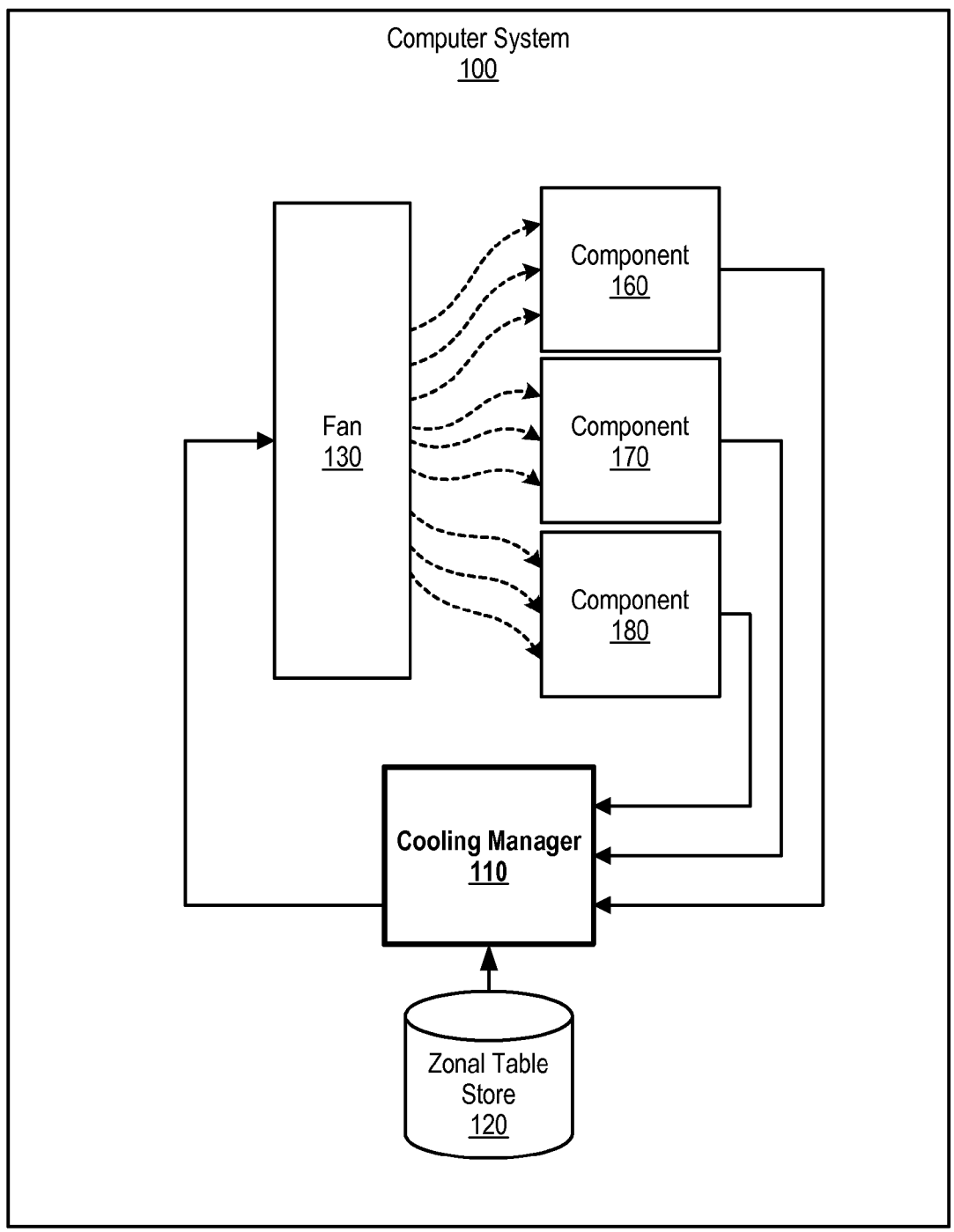
FIG. 1 is a diagram showing a computer system cooling electronic components according to a zonal table that groups pre-characterization data of a fan and components into operational zones.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The following detailed description will generally follow the summary of the disclosure, as set forth above, further explaining and expanding the definitions of the various aspects and embodiments of the disclosure as necessary.

FIG. 1 is a diagram showing a computer system cooling electronic components according to a zonal table that groups pre-characterization data of a fan and components into operational zones. This disclosure categorizes a fan's operation into several zones, with each zone representing a specific cooling capacity and associated fan power consumption (see FIGS. 2, 3, and corresponding text for further details). In one embodiment, the pre-characterization data is taken prior to computer system 100 operating in a field environment.

Cooling manager 110 retrieves a zonal table from zonal table store 120 and sets an initial fan speed setting for fan 130. In one embodiment, the initial fan speed setting is based on an optimized operational zone that is identified in the zonal table.

As components 160-180 operate, cooling manager 110 monitors temperature changes and determines whether to change operational zones in order to optimize fan 130's cooling capacity with a minimum amount of power. For example, components 160-180 may not be dissipating a large amount of heat, in which case cooling manager 110 selects the next lower operational zone and sets the fan speed of fan 130 according to the newly selected operational zone in order to reduce overall system power consumption.

Figure 6:
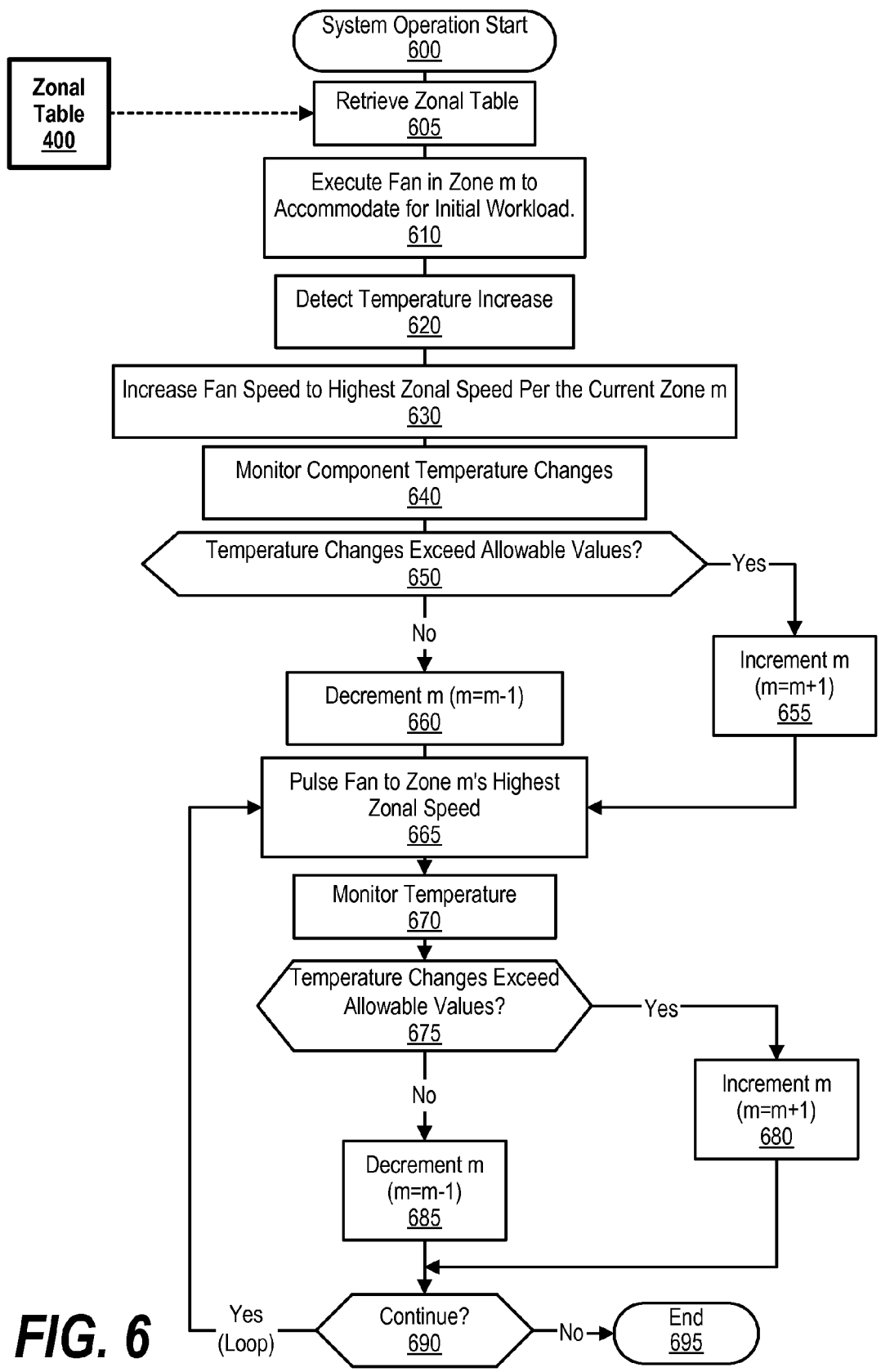
FIG. 6 is a flowchart showing steps taken in using a zonal table based on pre-characterization data to manage a computer system's thermal behavior.
Figure 7:
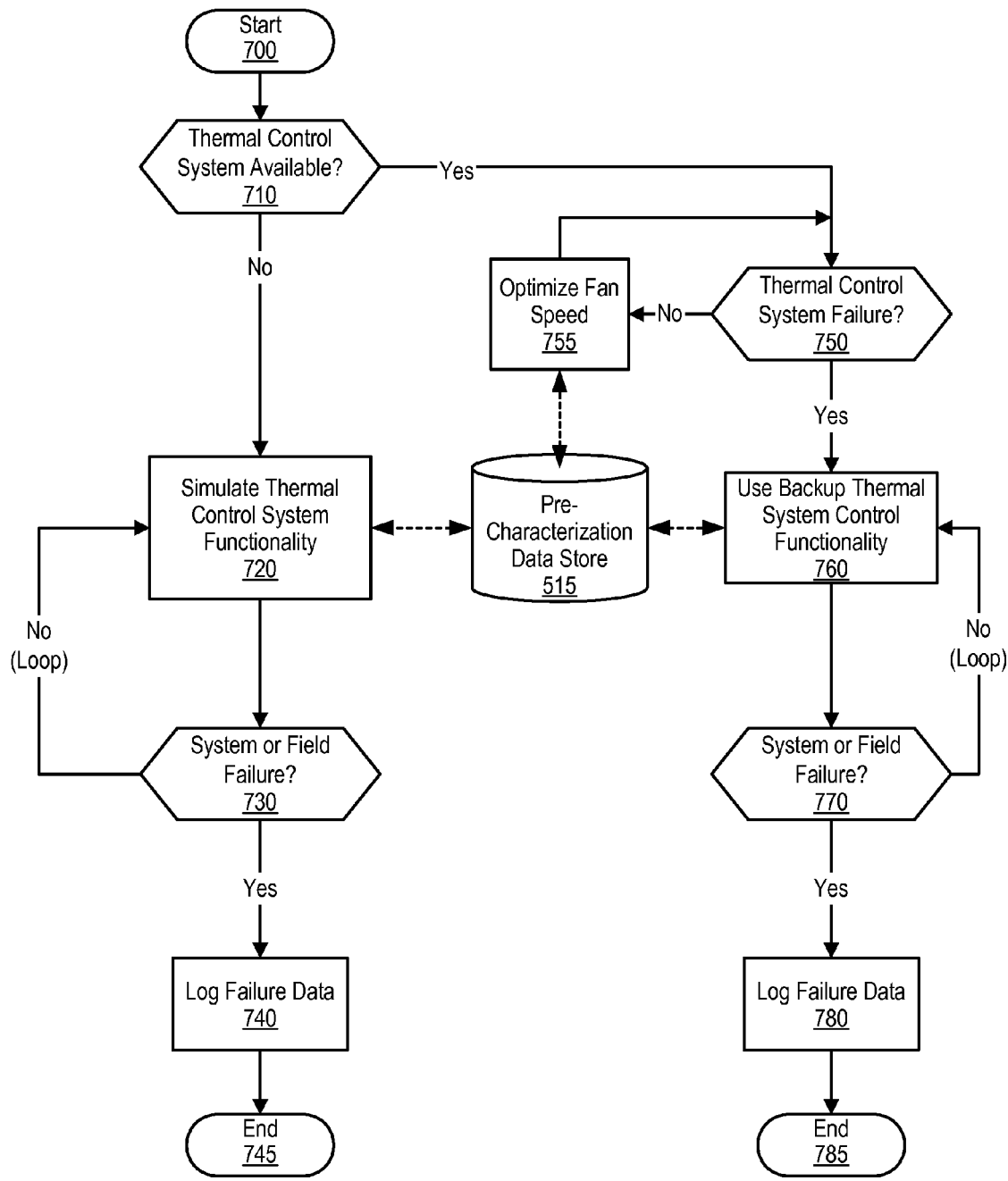
FIG. 7 is a flowchart showing steps taken in utilizing pre-characterization data to manage a computer system's cooling requirements.

In one embodiment, cooling manager 110 utilizes the pre-characterization data to aid a thermal control module to arrive at a decision as to whether to move the fan speed to lower zone by quantifying the magnitude of temperature rise (see FIG. 7 and corresponding text for further details). In another embodiment, cooling manager 110 uses the pre-characterization data to determine an amount of time to stay in a lower operational zone based on components 160-180's current power consumption pattern and temperature trend over time. Once the fan speed reaches the target operational zone, the process of attempting to reach lower operational zones continues, depending on the current/temperature trend (see FIG. 6 and corresponding text for further details).

In another embodiment, a process of fan speed change from one operational zone to a different operational zone (e.g., fan zonal pulsing rate) leverages a non-linear relationship of fan speed versus fan power to gain additional power savings using the pre-characterization data included in the zonal table. In this embodiment, a pre-emptive process capitalizes on stored cooling capacity to best manage/reduce the system power consumption. As such, cooling manager 110 balances the thermal and power requirements of computer system 100 by leveraging the operational zones and building a capacity to react to thermal or power changes instead of invoking extreme fan settings, thus also reducing acoustic energy.

FIG. 2 is a diagram showing pre-characterization data entries that include component data and fan data. Generating a characterization table involves numerous factors such as power, temperature, frequency, configuration etc., and a wide variety of workloads to test. In order to reduce the number of samples to collect during the characterization process, this disclosure builds pre-characterization data table 200 in an efficient manner that utilizes a reduced storage space and provides faster data access.

Characterization data table 200 includes pre-characterization data entries 260-285. Each of the pre-characterization data entries are collected at a time that one of the components generates a temperature change value that exceeds their corresponding specified temperature change value, herein referred to as a temperature change trigger point. The specified temperature change value is a specified temperature change value that may be different for each component, such as a processor may have a +/−5 C specified temperature change value and memory buffers may have a +/−3 C specified temperature change value. At each temperature change trigger point, temperature values, power consumption, and fan speeds are collected (sampled) and stored in a pre-characterization data entry. As such, the total number of samples are reduced compared with periodical sample collection.

Columns 230-255 include temperature values of processors, memories, and I/O components. FIG. 2 includes dashed circles around temperatures that invoked a temperature change trigger point. Entry 260 is an initial measurement at system boot-up. Entry 265 is taken because processor 1 exceeded its specified temperature change value (column 235). Entry 270 is taken because processor 0 exceeded its specified temperature change value (column 230). Entry 275 is taken because memory 1 exceeded its specified temperature change value (column 240). Entry 280 is taken because I/O 1 exceeded its specified offset value (column 250). And, entry 285 is taken because I/O 2 exceeded its specified temperature change value (column 255).

Column 205 includes indicators for a total system power value at corresponding temperature change trigger points. Columns 210, 215, and 220 include indicators for processor power, memory power, and I/O power, respectively at corresponding temperature change trigger points. Column 225 includes indicators for fan speed settings at the corresponding temperature change trigger points.

In one embodiment, during the process of collecting pre-characterization data, additional data estimating the weighing values for factors such as pre-heating, leakage power of components, ambient conditions, process variations etc. may be recorded as a profile or signature and used to manipulate or arrive at a base set of initial pre-characterization data for slightly varied hardware configurations. In this embodiment, a computer system may use the data to diagnose or detect variations and/or functional behavior changes in the system components.

Additionally, this disclosure optimizes the pre-characterization data by characterizing cooling rates and temperatures with respect to low, nominal and high power workloads. As such, boundary conditions of the computer system's thermal profile are identified and, by using the profile and current cooling rate during system operation, a computer system may interpolated/extrapolated the temperature values and determine appropriate fan speed settings (see FIG. 3 and corresponding text for further details).

Figure 3:
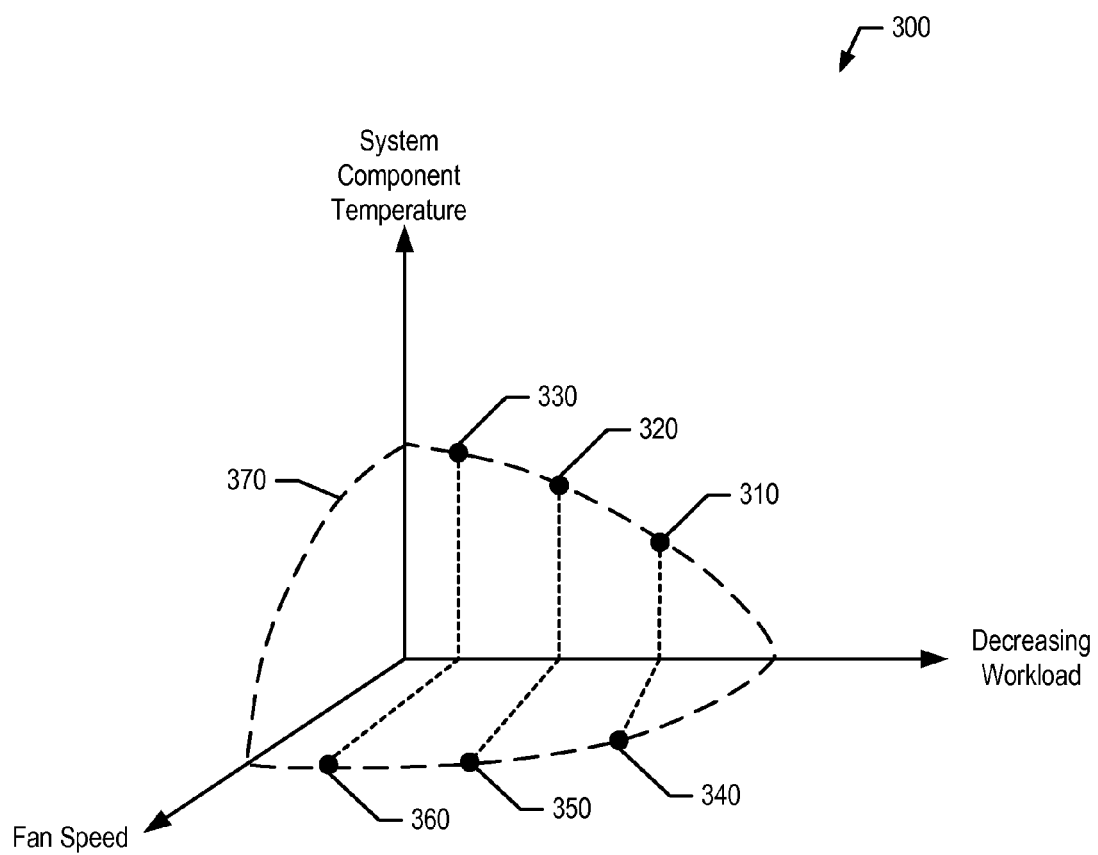
FIG. 3 is a diagram showing a mapping of boundary pre-characterization samples based on fan speed, workload, and component temperatures.

FIG. 3 is a diagram showing a mapping of boundary pre-characterization samples based on fan speed, workload, and component temperatures. Diagram 300 includes pre-characterization samples 310-360, which indicates cooling rates and temperatures with respect to low, nominal and high power workloads. For example, samples 310 and 340 are taken at a low workload, which indicates a lower system temperature (sample 310) and a lower fan speed (sample 340). As a result, a pre-characterization table is generated that establishes boundary conditions (boundary 370) of the computer system's thermal profile and, by using this profile and current cooling rate during system operation, the computer system may predict electronic component temperatures and set fan speeds without requiring a temperature sensor.

FIG. 4 is a diagram showing a zonal table that includes pre-characterization data grouped in to operational zones. Zonal table 400 allows a cooling manager to set a fan speed and optimize system power by saving power consumed by unnecessary higher fan settings.

Zonal table 400 includes columns 410, 420, and 430. Column 410 includes operational zone identifiers for the various zones. Column 420 includes an average fan power consumption for their corresponding zones. And, column 430 includes a lowest and highest fan speed setting for each of the operational zones.

In one embodiment, an optimization module (e.g., a TPMD) may optimally sets the fan speed using the data included in zonal table 400 and/or pre-characterization data table 200. As such, a computer system requires fewer sensors and provides protection when a sensor fails (see FIG. 7 and corresponding text for further details). In addition, the cooling manager reacts quickly based on power consumption instead of thermal reaction.

In another embodiment, the cooling system may determine fan speed based upon workload-based power consumption corresponding to multiple components and their relationship to temperature changes. In yet another embodiment, the computer system may monitor fan speed and fan power consumption in order to conserve overall system power by effectively tracking instantaneous temperatures with respect to the increasing/decreasing power.

Figure 5:
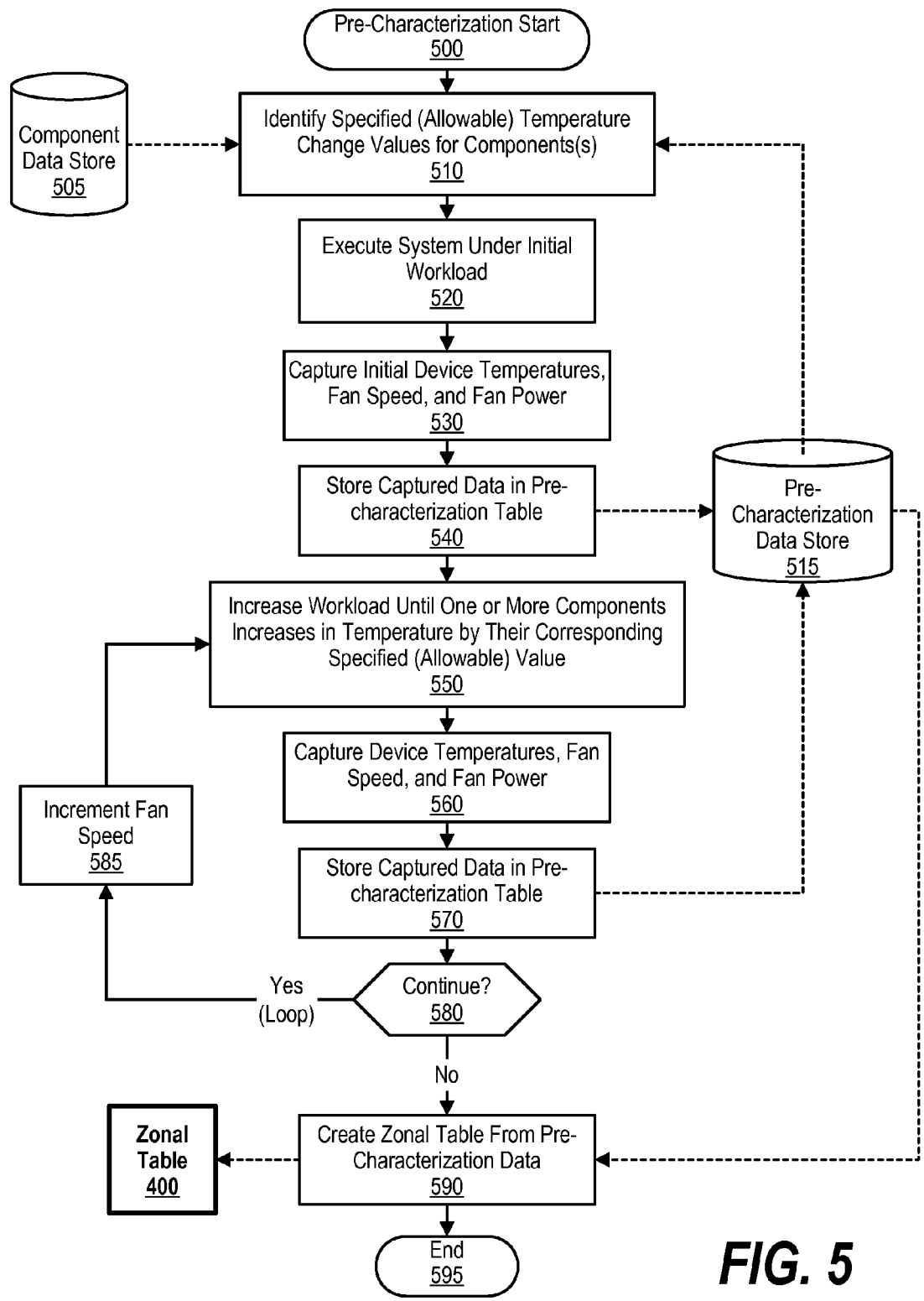
FIG. 5 is a flowchart showing steps taken in collecting pre-characterization data samples and grouping the pre-characterization data samples into operational zones.

FIG. 5 is a flowchart showing steps taken in collecting pre-characterization data samples and grouping the pre-characterization data samples into operational zones. This disclosure builds a pre-characterization table using a reduced storage space by collecting data at temperature change trigger points, which are points at which one or more components generate a temperature change that exceeds a specified temperature change value.

Processing commences at 500, whereupon processing identifies specified temperature change values for various electronic components at step 510 by retrieving and analyzing component data located in component data store 505. In one embodiment, the specified temperature change values may be different for each system component type (e.g., a processor may have +/−5 C and a memory buffer may have +/−3 C). For each cooling rate, the component temperature values are (sampled) and recorded when any of the components exceed their corresponding specified temperature change value (discussed below).

At step 520, processing executes the computer system under an initial workload and, at step 530, processing captures initial component temperatures, fan speed, and fan power. Processing stores the captured data in pre-characterization store 515 as a pre-characterization data entry at step 540.

At step 550, processing increases the computer system's workload until one or more of the electronic components increases in temperature by their specified temperature change value. Processing, at step 560, captures the component temperatures, fan sped, and fan power and stores the captured data in the pre-characterization table at step 570.

A determination is made as to whether to continue capturing pre-characterization data (decision 580). If processing should continue to capture pre-characterization data, decision 580 branches to the "Yes" branch, which loops back to increment the fan speed (step 585) and wait for one of the components to increase in temperature over their specified temperature change value. This looping continues until processing stops collecting data, at which point decision 580 branches to the "No" branch.

At step 590, processing creates zonal table 400 based upon the collected pre-characterization data. The zonal table groups the data entries according to fan power requirements (see FIG. 4 and corresponding text for further details), and processing ends at 595.

FIG. 6 is a flowchart showing steps taken in using a zonal table based on pre-characterization data to manage a computer system's thermal behavior.

Processing commences at 600, whereupon processing retrieves zonal information from zonal table 400 at step 605. At step 610, processing executes a fan in a particular operational zone "m" (zone identifier) to accommodate for an initial workload. In one embodiment, processing allows a TPMD to set the initial zone identifier.

At step 620, processing detects a temperature increase in one or more electronic components. Processing increases the fan speed (step 630) of the fan to a highest fan speed according to the selected zone identifier "m."

Processing monitors component temperature changes at step 640, and a determination is made as to whether the one or more of the components is generating a temperature change value that exceeds their corresponding specified temperature change value (decision 650). If so, decision 650 branches to the "Yes" branch, whereupon processing increments the zone identifier at step 655 and increases the fan speed to the highest fan speed corresponding to the new zone at step 665 to prevent overheating.

On the other hand, if none of the components are generating a temperature change that exceeds their specified temperature change values, decision 650 branches the "No" branch, whereupon processing decrements the zone identifier at step 660 in order to conserve fan power consumption. At step 665, processing sets the fan speed to the highest fan speed corresponding to the decremented zone identifier in order to maintain reduced power consumption and provide optimum zonal cooling capacity.

At step 670, processing monitors component temperatures and a determination is made as to whether one or more of the components generates a temperature change value that exceeds their corresponding specified temperature change value (decision 675). If so, decision 675 branches to the "Yes" branch, whereupon processing increments the zone identifier at step 680. On the other hand, if the temperature changes do not exceed the specified temperature change values, decision 675 branches to the "No" branch, whereupon processing decrements the zone identifier at step 685.

A determination is made as to whether to terminate processing (decision 690). If processing should continue, decision 690 branches to the "Yes" branch, whereupon processing sets the fan speed to the highest zonal speed corresponding to the incremented/decremented zone indicator (step 665). This looping continues until processing should terminate, at which point decision 690 branches to the "No" branch, whereupon processing ends at 695.

FIG. 7 is a flowchart showing steps taken in utilizing pre-characterization data to manage a computer system's cooling requirements.

Processing commences at 700, whereupon a determination is made as to whether the computer system has a thermal control system available, such as a thermal and power control module (TPMD) (decision 710). If a thermal control system is not available, decision 710 branches to the "No" branch, whereupon processing simulates thermal control system functionality at step 720 utilizing pre-characterization data stored in pre-characterization data store 515.

In one embodiment, processing may predict a temperature rise from a rise in power consumption and determine its criticality. In this embodiment, if the temperature rise is not critical, processing may leave the fan speed at the same level to conserve fan power consumption. If the component is critical, processing may increase the fan speed to cool the electronic component to an acceptable level according to the pre-characterization data.

A determination is made as to whether the computer system has a failure, such as a malfunctioning electronic component (decision 730). If no failure exists, decision 730 branches to the "No" branch, which loops back to continue simulating thermal control. This looping continues until processing detects a failure, at which point decision 730 branches to the "Yes" branch, whereupon processing logs failure data at step 740 and ends at 745.

Referring back to decision 710, if the computer system has a thermal control system, decision 710 branches to the "Yes" branch, whereupon a determination is made as to whether the thermal control system is functioning correctly (decision 750). If the thermal control system is functioning correctly, decision 750 branches to the "No" branch, whereupon processing utilizes the pre-characterization data to optimize the fan speed at step 755.

On the other hand, if the thermal control system failed, decision 750 branches to the "Yes" branch, whereupon processing uses the pre-characterization data to perform backup thermal system control functionality (step 760), such as that similar to step 720 discussed above.

A determination is made as to whether the computer system has a failure, such as a malfunctioning electronic component (decision 770). If no failure exists, decision 770 branches to the "No" branch, which loops back to continue simulating thermal control. This looping continues until processing detects a failure, at which point decision 770 branches to the "Yes" branch, whereupon processing logs failure data at step 780 and ends at 785.

In one embodiment, processing may optimize the fan speed by monitoring intermediate levels of higher power consumption. In this embodiment, for example, if the power of an electronic component peaks due to higher current activity, its temperature may take a while to update, but the electronic component's workload may decrease. As such, an instant reaction to bump the fan speed to higher levels may not be required. In this embodiment, processing may adjust the fan speed based on the pre-characterization data that allows the temperature to rise up to a critical level and continuously monitor the temperature. This may also provide processing an indication of how the workload changes. In cases where the workload hits a maximum level and reduces to normal levels, unnecessary fan changes to a higher rpm may be avoided. As such, the net result allows the electronic component to heat up by keeping the fan speed in minimum levels as long as the temperature levels are not critical, thus decreasing overall power consumption.

Figure 8:
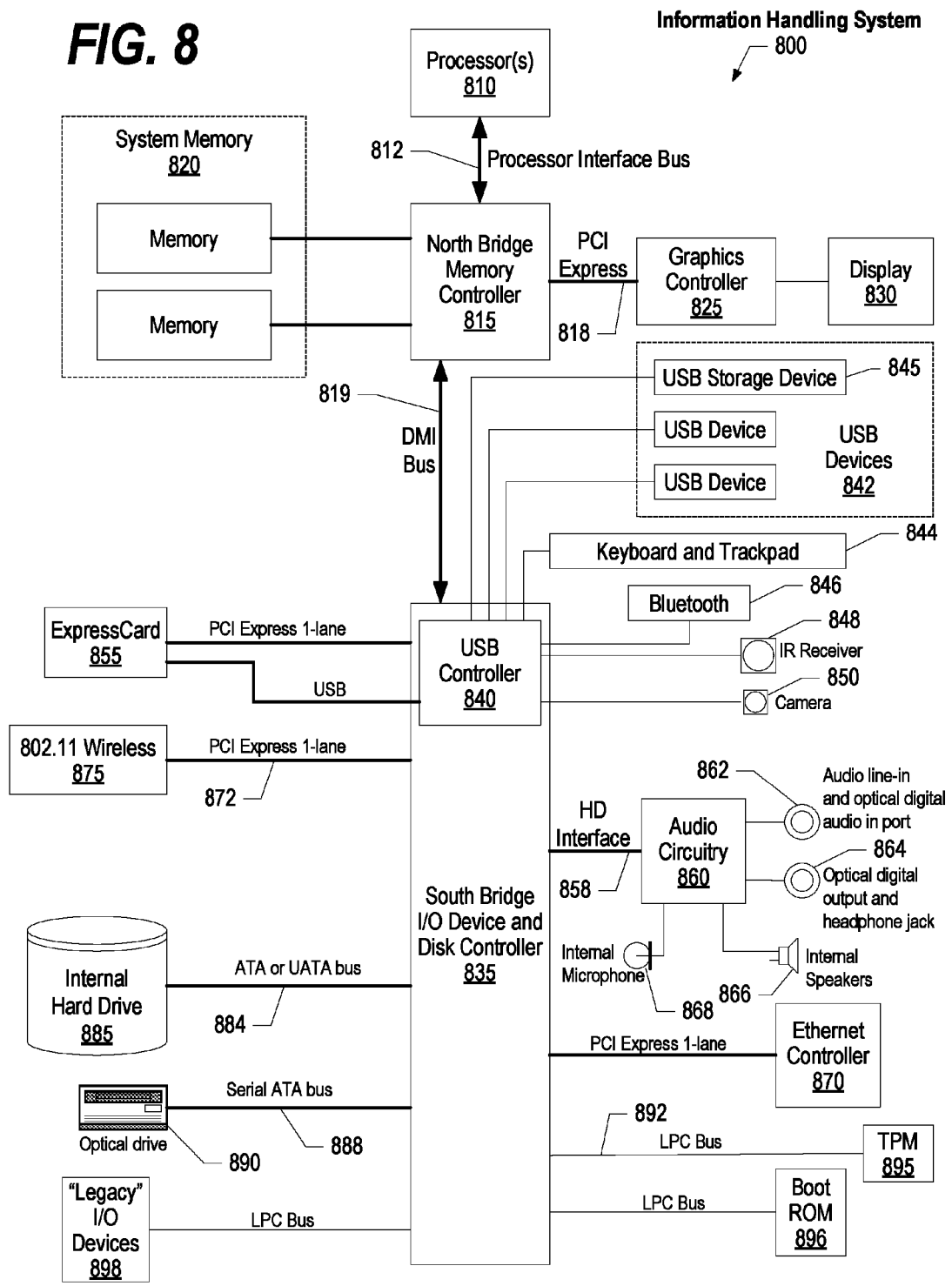
FIG. 8 is a block diagram of a data processing system in which the methods described herein can be implemented.

FIG. 8 illustrates information handling system 800, which is a simplified example of a computer system capable of performing the computing operations described herein. Information handling system 800 includes one or more processors 810 coupled to processor interface bus 812. Processor interface bus 812 connects processors 810 to Northbridge 815, which is also known as the Memory Controller Hub (MCH). Northbridge 815 connects to system memory 820 and provides a means for processor(s) 810 to access the system memory. Graphics controller 825 also connects to Northbridge 815. In one embodiment, PCI Express bus 818 connects Northbridge 815 to graphics controller 825. Graphics controller 825 connects to display device 830, such as a computer monitor.

Northbridge 815 and Southbridge 835 connect to each other using bus 819. In one embodiment, the bus is a Direct Media Interface (DMI) bus that transfers data at high speeds in each direction between Northbridge 815 and Southbridge 835. In another embodiment, a Peripheral Component Interconnect (PCI) bus connects the Northbridge and the Southbridge. Southbridge 835, also known as the I/O Controller Hub (ICH) is a chip that generally implements capabilities that operate at slower speeds than the capabilities provided by the Northbridge. Southbridge 835 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 896 and "legacy" I/O devices (using a "super I/O" chip). The "legacy" I/O devices (898) can include, for example, serial and parallel ports, keyboard, mouse, and/or a floppy disk controller. The LPC bus also connects Southbridge 835 to Trusted Platform Module (TPM) 895 via bus 892. Other components often included in Southbridge 835 include a Direct Memory Access (DMA) controller, a Programmable Interrupt Controller (PIC), and a storage device controller, which connects Southbridge 835 to nonvolatile storage device 885, such as a hard disk drive, using bus 884.

ExpressCard 855 is a slot that connects hot-pluggable devices to the information handling system. ExpressCard 855 supports both PCI Express and USB connectivity as it connects to Southbridge 835 using both the Universal Serial Bus (USB) the PCI Express bus. Southbridge 835 includes USB Controller 840 that provides USB connectivity to devices that connect to the USB. These devices include webcam (camera) 850, infrared (IR) receiver 848, keyboard and trackpad 844, and Bluetooth device 846, which provides for wireless personal area networks (PANs). USB Controller 840 also provides USB connectivity to other miscellaneous USB connected devices 842, such as a mouse, removable nonvolatile storage device 845, modems, network cards, ISDN connectors, fax, printers, USB hubs, and many other types of USB connected devices. While removable nonvolatile storage device 845 is shown as a USB-connected device, removable nonvolatile storage device 845 could be connected using a different interface, such as a Firewire interface, etcetera.

Wireless Local Area Network (LAN) device 875 connects to Southbridge 835 via the PCI or PCI Express bus 872. LAN device 875 typically implements one of the IEEE 802.11 standards of over-the-air modulation techniques that all use the same protocol to wireless communicate between information handling system 800 and another computer system or device. Optical storage device 890 connects to Southbridge 835 using Serial ATA (SATA) bus 888. Serial ATA adapters and devices communicate over a high-speed serial link. The Serial ATA bus also connects Southbridge 835 to other forms of storage devices, such as hard disk drives. Audio circuitry 860, such as a sound card, connects to Southbridge 835 via bus 858. Audio circuitry 860 also provides functionality such as audio line-in and optical digital audio in port 862, optical digital output and headphone jack 864, internal speakers 866, and internal microphone 868. Ethernet controller 870 connects to Southbridge 835 using a bus, such as the PCI or PCI Express bus. Ethernet controller 870 connects information handling system 800 to a computer network, such as a Local Area Network (LAN), the Internet, and other public and private computer networks.

While FIG. 8 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 895) shown in FIG. 8 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 9.

Figure 9:
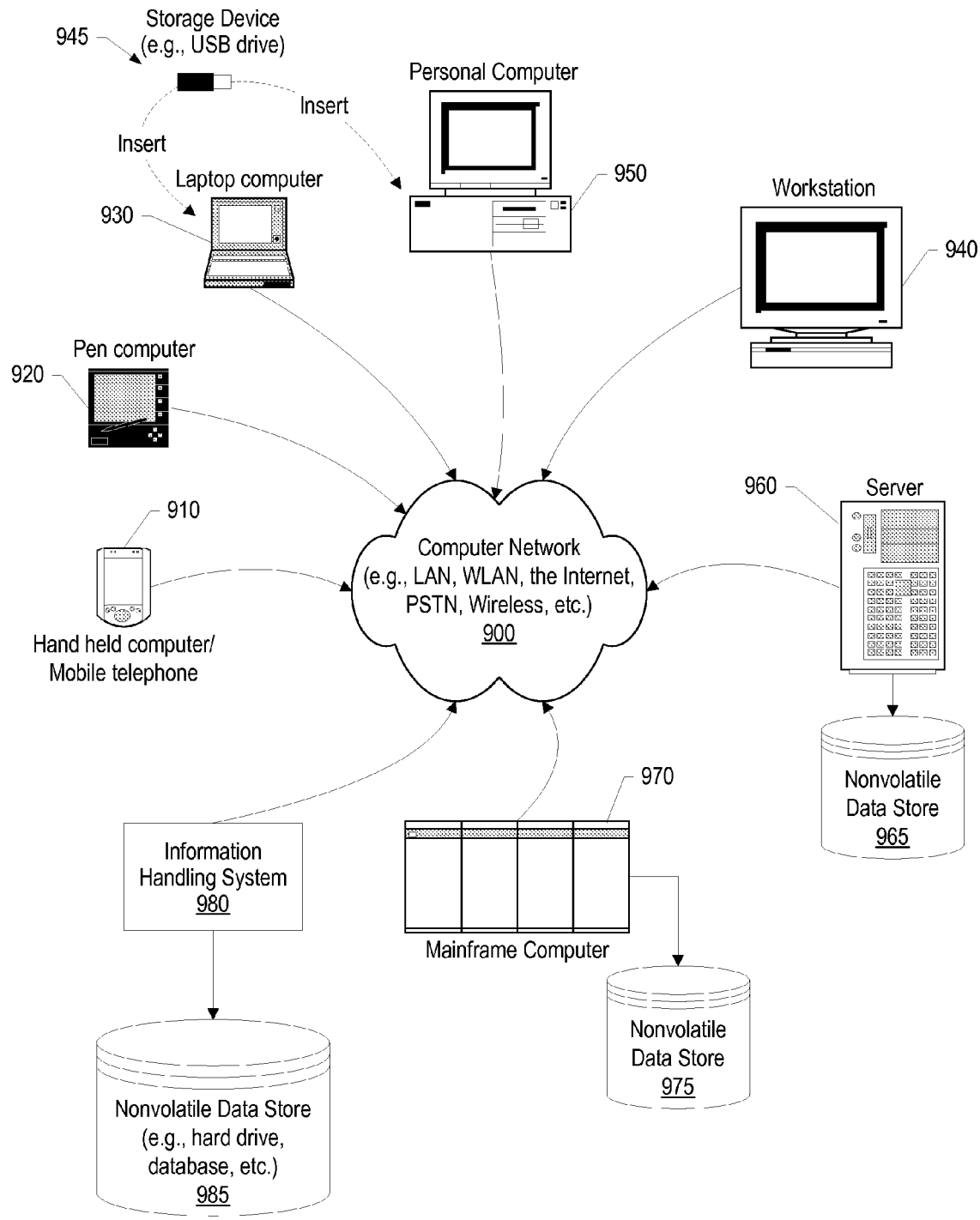
FIG. 9 provides an extension of the information handling system environment shown in FIG. 8 to illustrate that the methods described herein can be performed on a wide variety of information handling systems which operate in a networked environment.

FIG. 9 provides an extension of the information handling system environment shown in FIG. 8 to illustrate that the methods described herein can be performed on a wide variety of information handling systems that operate in a networked environment. Types of information handling systems range from small handheld devices, such as handheld computer/mobile telephone 910 to large mainframe systems, such as mainframe computer 970. Examples of handheld computer 910 include personal digital assistants (PDAs), personal entertainment devices, such as MP3 players, portable televisions, and compact disc players. Other examples of information handling systems include pen, or tablet, computer 920, laptop, or notebook, computer 930, workstation 940, personal computer system 950, and server 960. Other types of information handling systems that are not individually shown in FIG. 9 are represented by information handling system 980. As shown, the various information handling systems can be networked together using computer network 900. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems.

Many of the information handling systems include nonvolatile data stores, such as hard drives and/or nonvolatile memory. Some of the information handling systems shown in FIG. 9 depicts separate nonvolatile data stores (server 960 utilizes nonvolatile data store 965, mainframe computer 970 utilizes nonvolatile data store 975, and information handling system 980 utilizes nonvolatile data store 985). The nonvolatile data store can be a component that is external to the various information handling systems or can be internal to one of the information handling systems. In addition, removable nonvolatile storage device 945 can be shared among two or more information handling systems using various techniques, such as connecting the removable nonvolatile storage device 945 to a USB port or other connector of the information handling systems.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method comprising:
executing a first workload and storing a first set of component data and a first set of fan data, wherein the first set of component data corresponds to one or more components and the first set of fan data corresponds to at least one fan that cools at least one of the one or more components;
increasing the first workload to a second workload that causes at least a selected one of the one or more of the components to generate a temperature change value that exceeds a specified temperature change value;
storing a second set of component data and a second set of fan data in response to the selected component generating the temperature change value exceeding the specified temperature change value;
determining a plurality of operational zones based upon at least the first set of fan data and the second set of fan data, wherein the plurality of operational zones are categorized according to an average fan power requirement of a plurality of fan speeds within each of the plurality of operational zones;
setting the at least one fan to a first speed setting within a first operational zone included in the plurality of operational zones;
detecting, in response to setting the at least one fan to the first speed setting, that one of the components generates a temperature change value that exceeds the specified temperature change value; and
setting the at least one fan to a second speed setting within a second operational zone included in the plurality of operational zones in response to the detecting.

2. The method of claim 1 wherein the second speed setting is a highest fan speed setting within the second operational zone.

3. The method of claim 2 further comprising:
determining, while the fan is operating at the highest fan speed setting, that none of the one or more components generates a subsequent temperature change value that exceeds their corresponding specified temperature change values; and
selecting the first operational zone and setting the fan to a subsequent highest fan speed setting corresponding to the first operational zone, wherein the subsequent highest fan speed setting corresponding to the first operational zone is slower than the highest fan speed setting corresponding to the second operational zone.

4. The method of claim 1 further comprising:
detecting a thermal sensor failure included in the computer system;
in response to the detecting, invoking a backup thermal manager that performs the setting of the fan based upon the pre-characterization data.

5. The method of claim 1 further comprising:
computing a system power consumption;
analyzing the plurality of operational zones and identifying a fan speed setting that corresponds to the computed system power consumption; and
setting the fan to the identified fan speed setting.

6. The method of claim 5 further comprising:
identifying a temperature value that corresponds to the computed system power consumption; and
performing the identification of the fan speed setting utilizing the identified temperature value.

7. A method comprising:
executing a first workload and storing a first set of component data and a first set of fan data, wherein the first set of component data corresponds to one or more components and the first set of fan data corresponds to at least one fan that cools at least one of the one or more components;
increasing the first workload to a second workload that causes at least a selected one of the one or more of the components to generate a temperature change value that exceeds a specified temperature change value;
storing a second set of component data and a second set of fan data in response to the selected component generating the temperature change value exceeding the specified temperature change value;
determining a plurality of operational zones based upon at least the first set of fan data and the second set of fan data, wherein the plurality of operational zones are categorized according to an average fan power requirement of a plurality of fan speeds within each of the plurality of operational zones;
setting the at least one fan to a first speed setting within a first operational zone included in the plurality of operational zones;
detecting, in response to setting the at least one fan to the first speed setting, that one of the components generates a temperature change value that exceeds the specified temperature change value;
selecting, in response to the detecting, a second operational zone from the plurality of operational zones;

setting the at least one fan to a second speed setting within the second operational zone, wherein the second speed setting is a highest fan speed setting within the second operational zone;

determining, while the at least one fan is operating at the highest fan speed setting, that none of the one or more components generates a subsequent temperature change value that exceeds their corresponding specified temperature change values; and selecting the first operational zone and setting the at least one fan to a subsequent highest fan speed setting corresponding to the first operational zone, wherein the subsequent highest fan speed setting corresponding to the first operational zone is slower than the highest fan speed setting corresponding to the second operational zone.

* * * * *